United States Patent
Ivan et al.

(10) Patent No.: US 8,044,358 B2
(45) Date of Patent: Oct. 25, 2011

(54) SPECTROSCOPIC FAST NEUTRON DETECTION AND DISCRIMINATION USING LI-BASED SEMICONDUCTORS

(75) Inventors: Adrian Ivan, Niskayuna, NY (US); Daniel Bruno McDevitt, Galway, NY (US); Brent Allen Clothier, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 343 days.

(21) Appl. No.: 12/491,704

(22) Filed: Jun. 25, 2009

(65) Prior Publication Data

US 2010/0327170 A1 Dec. 30, 2010

(51) Int. Cl.
*G01T 3/08* (2006.01)
(52) U.S. Cl. ....... 250/370.05; 438/57; 438/96; 257/429; 252/518.1
(58) Field of Classification Search .............. 252/518.1; 257/429; 250/370.05; 438/57, 96
See application file for complete search history.

(56) References Cited

OTHER PUBLICATIONS

R. Bacewicz and T.F. Ciszek, "Preparation and characterization of some AI BII CV type semiconductors", American Institute of Physics, Applied Physics Letters, vol. 52, No. 14, Apr. 4, 1988, pp. 1150-1151.*

L.H. H Yu et al., "Electronic structures of filled tetrahedral semiconductors LiMgN and LiZnN; conduction band distortion." Elsevier, Physica B, The American Physical Society, vol. 353, 2004, pp. 278-286.*
K. Kuriyama et al, "Optical Band gap of the filled tetrahedral semiconductor LiZP," Rapid Communication, Physical Review B, vol. 37, No. 12, Apr. 15, 1988-II, pp. 7140-7142.*
A.J. Nelson et al, "Synchrotron Radiation Photoemission Study of the Electronic Structure of the Filled Tetrahedral Semiconductors LiZnAs and LiZnP," Journal of Electron Spectroscopy and Related Phenomena, vol. 51, 1990, pp. 623-628.*
K. Shah, G.Entine, "Solid-State NeutronDetection with LiZnP", DOE Grant No. DE-FG02-98ER82651 (2009), http://www.science.doe.gov/sbir/awards_abstracts/sbir/cycle16/phase1/intro.htm, Item#108.*

* cited by examiner

*Primary Examiner* — David Porta
*Assistant Examiner* — Hugh H Maupin
(74) *Attorney, Agent, or Firm* — Joseph J. Christian (57) ABSTRACT

A neutron sensing material detector includes an anode; a cathode; and a semiconductor material disposed between the anode and the cathode. An electric field is applied between the anode and cathode. The semiconductor material is composed of a ternary composition of stoichiometry $LiM^{2+}G^V$ and exhibits an antifluorite-type ordering, where the stoichiometric fractions are $Li=1$, $M^{2+}=1$, and $G^V=1$. Electron-hole pairs are created by absorption of radiation, and the electron-hole pairs are detected by the current they generate between the anode and the cathode. The anode may include an array of pixels to provide improved spatial and energy resolution over the face of the anode. The signal value for each pixel can be mapped to a color or grey scale normalized to all the other pixel signal values for a particular moment in time. A guard ring or guard grid may be provided to reduce leakage current.

14 Claims, 6 Drawing Sheets

SPECTROSCOPIC FAST NEUTRON DETECTION AND DISCRIMINATION USING LI-BASED SEMICONDUCTORS

CROSS-NOTING TO RELATED APPLICATIONS

This application is related to application Ser. No. 12/211,894, filed Sep. 17, 2008, entitled "SEMICONDUCTOR MATERIAL FOR RADIATION ABSORPTION AND DETECTION".

BACKGROUND OF THE INVENTION

1. Field of the Invention

The teachings herein relate in general to the detection of ionizing radiation and more particularly to spectroscopic fast neutron detection and discrimination using Li-based semiconductors.

2. Description of the Related Art

Figure 3:
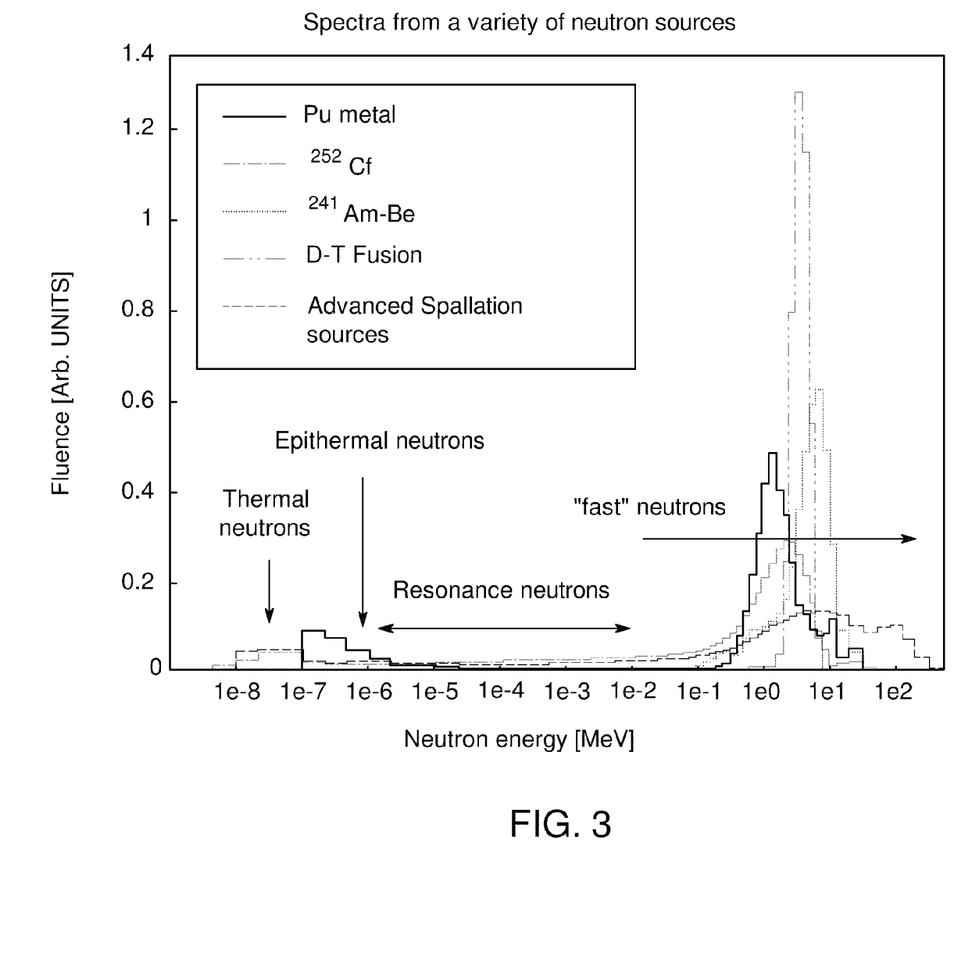
FIG. 3 is a graphical representation of the conventional energy domains for neutrons.
Figure 4:
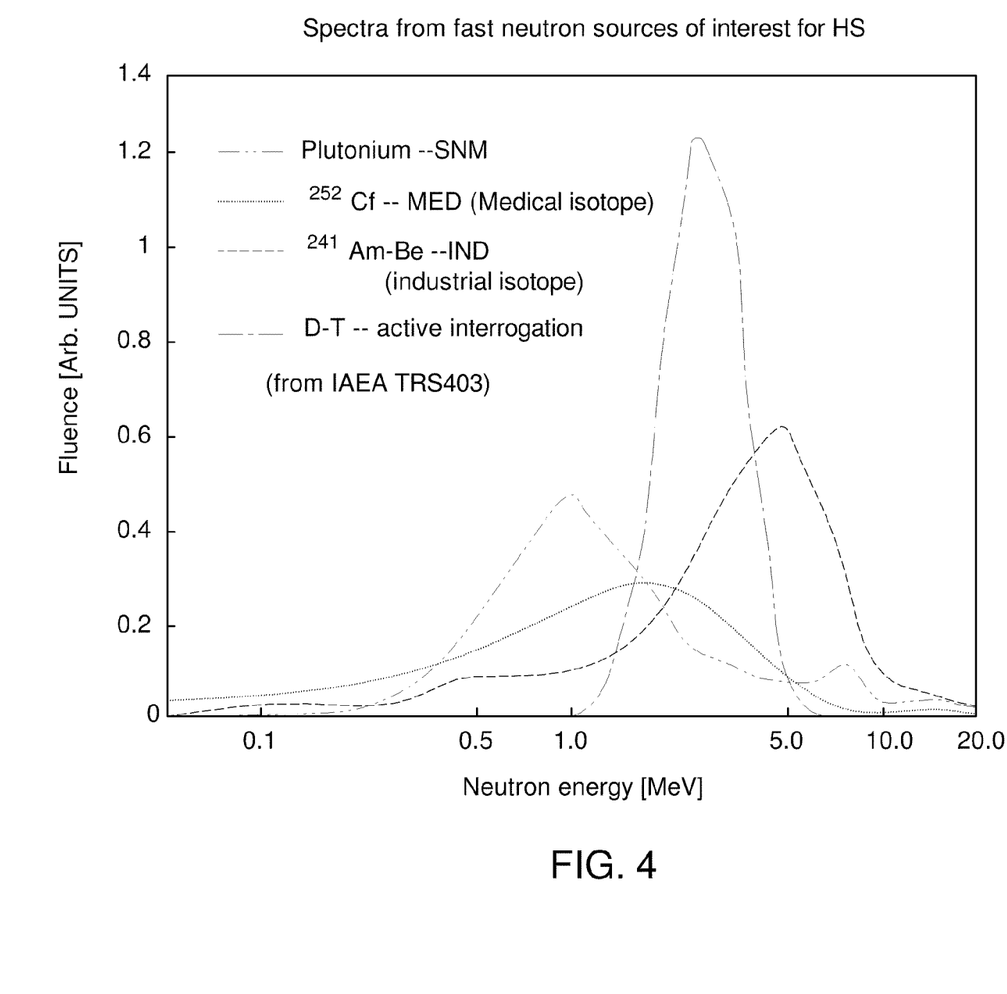
FIG. 4 is a graphical representation of the spectra from fast neutron sources of interest for Homeland Security applications.
Figure 5:
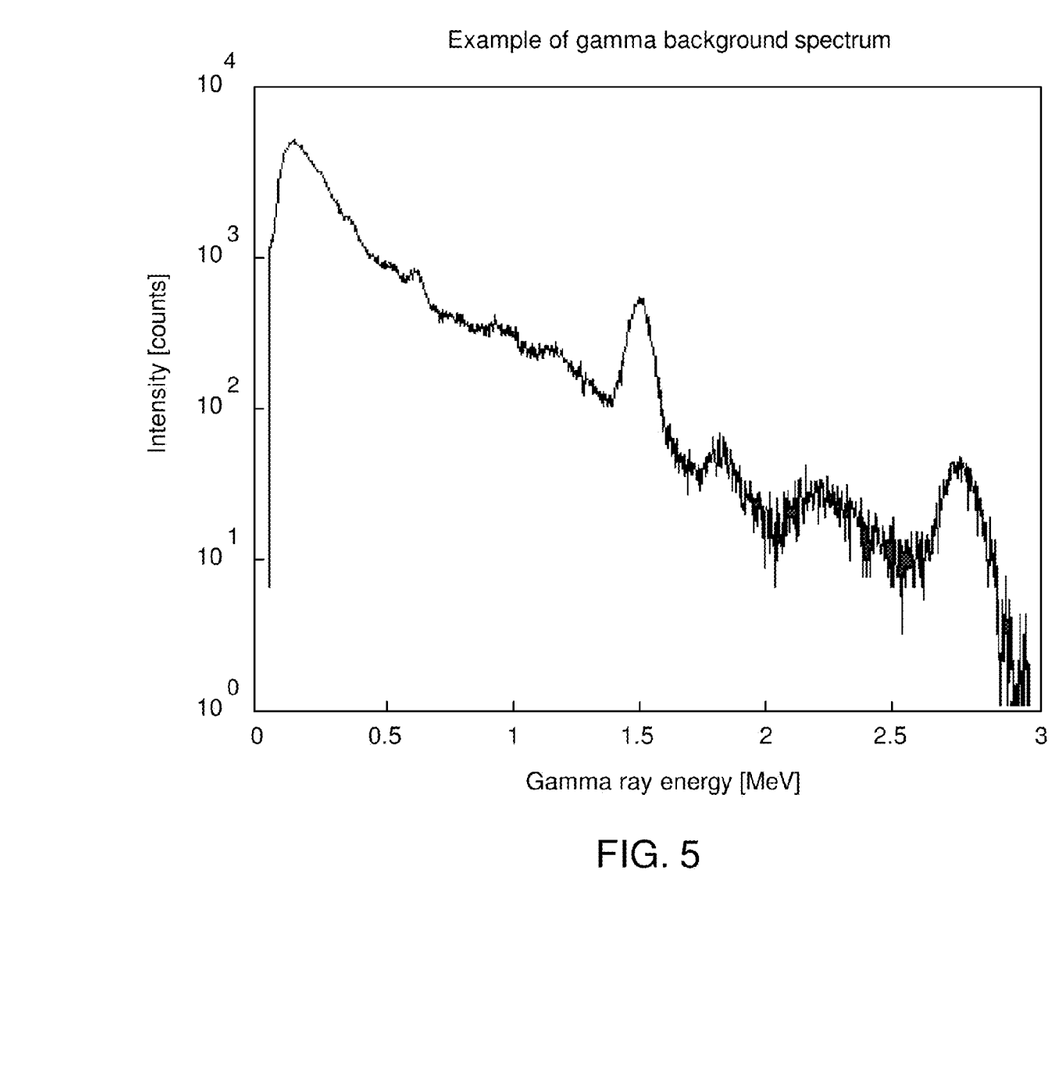
FIG. 5 is a graphical representation of an example of gamma background spectrum.

As shown in FIG. 3, the conventional energy domains for neutrons are labeled as: (i) thermal neutron energy ($E_n$=2.5 E-8 MeV); (ii) epithermal neutrons (2.5 E-8 MeV<$E_n$<1 e-6 MeV); (iii) resonance neutrons (1 e-6 MeV<$E_n$<0.01 MeV); and (iv) fast neutrons (En>0.01 MeV). FIG. 4 shows the energy region of interest ("fast neutrons") to better show the challenge in measuring with sufficient accuracy the neutron energy spectra of different neutron sources. In addition to fast neutrons arriving directly from their source, the detectors used in field applications must discriminate the following types of radiation: (A) fast neutrons generated by cosmic rays, (B) neutrons from the source that have lost energy by collisions with nearby shielding, ground, bodies of water, buildings, etc., and (C) gamma rays from the natural background covering a range of energies up to 3 MeV ($E_{gamma}$), as shown in FIG. 5.

Neutron sensing has been addressed in the past using scintillating material, ionizing gas materials and diffused solid material or a combination of any of these. The scintillating materials usually include elements presenting natural isotopes with large neutron reaction cross sections, which, upon absorbing a neutron, decay into charged particles. These charged particles lose energy within the scintillator and produce light intensities proportional to the energy of the incident neutron. The ionizing gas materials contain neutron-absorbing isotopes in a gaseous form under a large voltage gradient. Neutrons absorbed in the gas cause nuclear decay in the gaseous material and the decay products are accelerated towards one of the high voltage electrodes. The signal emitted by each electrode is proportional to the energy of the incident neutron. The diffused solid material uses small concentrations of neutron absorbing isotopes diffused into a semiconductor material. Upon capture of the incident neutron, the neutron-absorbing isotope decays and its charged decay products produce current pulses in the semiconductor material which are proportional to the incident neutron energy.

Improving the energy resolution for the scintillator-based approach has been addressed in the past by improving the scintillating material composition and/or using more efficient photomultiplier tubes or photo diodes. The energy resolution in the ionizing gas neutron detectors has been improved in the past by using improved data acquisition electronics with optimal shaping times and pileup rejection circuitry.

A neutron detector with spectroscopic (i.e., energy measurement) capability should be efficient in capturing the neutrons and converting their energy into a physical quantity measurable with sufficient precision. At the same time, the detector must be relatively insensitive to gamma rays and capable of separating their signal from the neutron signal.

Fast neutron spectroscopy has mostly been applied in areas of basic research (nuclear physics and astrophysics) and has commercial applications in the nuclear energy domain (reactor operation, fuel and waste management) or for radiodosimetry (either for reactor personnel or neutron-based cancer therapy). Recently, it has been recognized that neutron detection can be a complementary technique to gamma ray spectrometry for Homeland Security applications. Mainstream commercial neutron detectors, however, perform only simple neutron counting.

Even though energy resolution for the diffused $^6$Li neutron detectors have been recently improved through increased $^6$Li loading and the use of better data acquisition electronics, none of the previous methods of data acquisition has the ability of achieving superior energy resolution.

What is needed is a spectroscopic fast neutron detection and discrimination detector that provides superior energy resolution for Homeland Security in applications such as passive identification of radioisotopes with spontaneous fission or active interrogation/verification.

BRIEF SUMMARY OF THE INVENTION

One aspect of the invention includes a neutron sensing material detector comprising an anode; a cathode; and a semiconductor material disposed between the anode and the cathode. An electric field is applied between the anode and the cathode. The semiconductor material comprises a ternary composition of stoichiometry $LiM^{2+}G^V$ and exhibiting an antifluorite-type ordering, where the stoichiometric fractions are Li=1, $M^{2+}$=1, and $G^V$=1, and wherein electron-hole pairs are created by absorption of radiation, and the electron-hole pairs are detected by the current they generate between the anode and the cathode.

In another aspect of the invention, a method for neutron detection, comprises:

disposing a semiconductor material between an anode and a cathode, wherein an electric field is applied between the anode and the cathode, wherein the semiconductor material comprises a ternary composition of stoichiometry $LiM^{2+}G^V$ and exhibits an antifluorite-type ordering, where the stoichiometric fractions are Li=1, $M^{2+}$=1, and $G^V$=1, and wherein electron-hole pairs are created by absorption of radiation; and detecting the current generated by the electron-hole pairs.

DETAILED DESCRIPTION OF THE INVENTION

Figure 1:
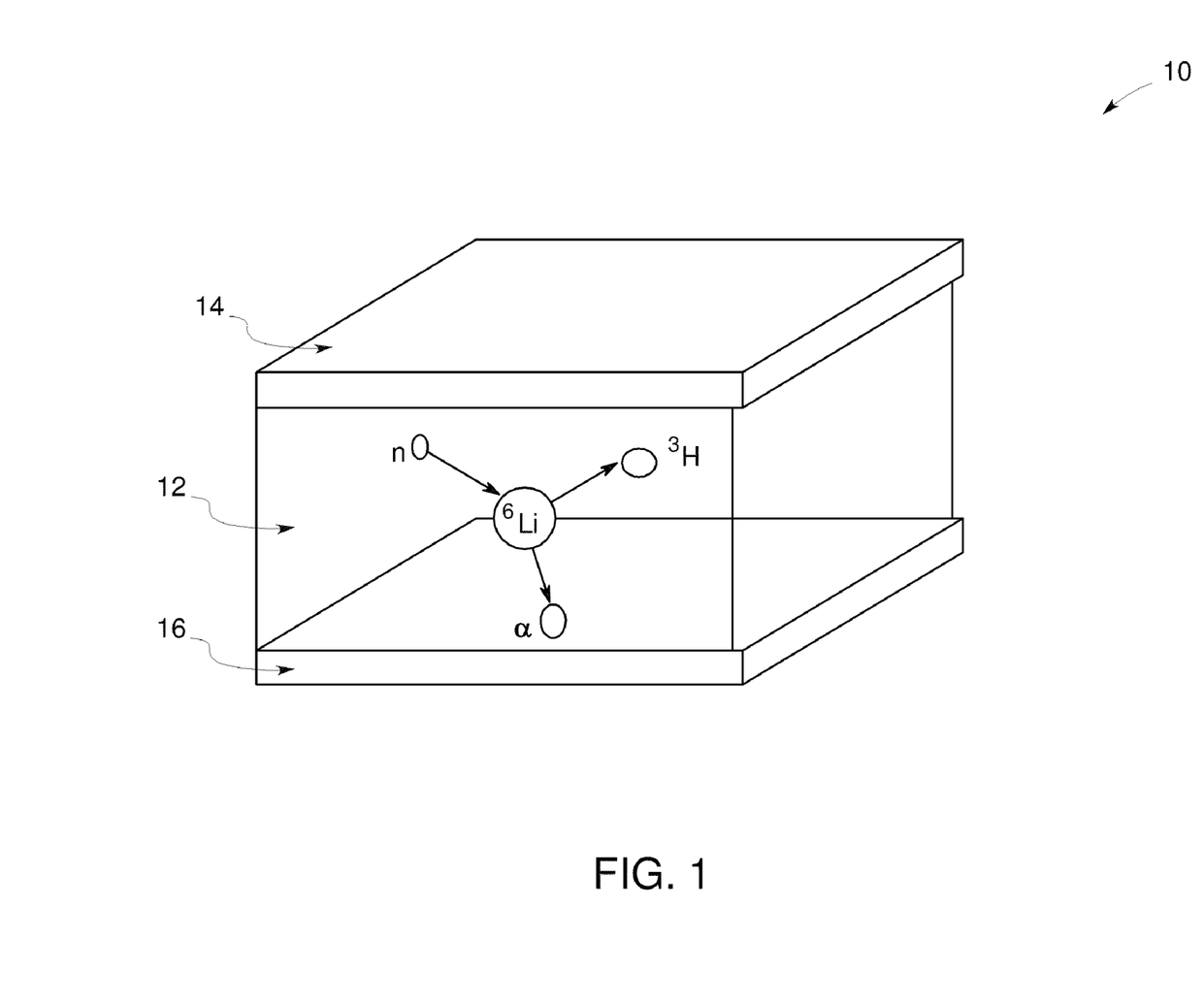
FIG. 1 is a perspective view of a schematic of a neutron sensing material detector (NSD) according to an embodiment of the invention.

Referring now to FIG. 1, a neutron sensing material detector (NSD) is shown generally at 10 according to an embodiment of the invention. The NSD 10 includes a semiconductor material 12 disposed between an anode 14 and a cathode 16.

In general, the semiconductor material 12 comprises the isotope $^6$Li that captures an incident neutron. The resulting compound nucleus decays into two particles; $^4$He and $^3$H, with a Q-value of the reaction energy of 4.78 MeV. For an incident neutron having an energy E', the kinetic energy shared amongst the capture reaction products ($^4$He (alpha) and $^3$H (triton)) is Q+E'.

The $^6$Li-based semiconductor material 12 offers the following technical advantages:

(1) Solid-state detection at room temperature (no pressurized gas containers or toxic gases/liquids/plastics).

(2) Scalable size (small for portable detectors, large area arrays for portals).

(3) Simple delta-function energy response; no secondary gamma generation like $^{10}$B.

(4) Highest Q-value for neutron absorption offers high threshold for gamma discrimination.

(5) Highest neutron cross section in the 0.2-0.4 MeV range and second highest above 0.4 MeV.

(6) Based on semiconductor materials with Li atomic densities approaching lithium metal and orders of magnitude superior to $^3$He gas in commercial detectors.

In particular, the semiconductor material 12 comprises a series of compositions of stoichiometry LiM$^{2+}$G$^V$ whose atomic constituents exhibit an antifluorite-type ordering. In the embodiment, M$^{2+}$ and G$^V$ refer to, respectively, any divalent metal or Group V pnictogens which together stabilize antifluorite-type ordering. Furthermore, M$^{2+}$ and G$^V$ can be comprised of either individual elements (e.g., end-members) or combinations of elements (e.g., substitutional alloying). For example, LiMgP and LiZnAs are end-members, but Li(Mg,Zn)(As,P) is an alloy. The generic formula is thus: Li(M$_1^{2+}$, M$_2^{2+}$, M$_3^{2+}$, ...)(G$_1^V$, G$_2^V$, G$_3^V$, ...) where the stoichiometric fractions are Li=1, M$_1^{2+}$+M$_2^{2+}$+M$_3^{2+}$+...=1, and G$_1^V$+G$_2^V$+G$_3^V$+...=1. For brevity, however, the nomenclature LiM$^{2+}$G$^V$ will be used with the generic formula presumed.

Examples of M$^{2+}$ include, but are not limited to, the group consisting of: Be, Mg, Ca, Sr, Ba, V, Cr, Mn, Fe, Ru, Os, Cr, Rh, Ir, Ni, Pd, Pt, Cu, Zn, Cd, Hg, Sn, Pb, and combinations thereof. The Group V pnictogens are selected from the group consisting of N, P, As, Sb, Bi, and combinations thereof.

Figure 6:
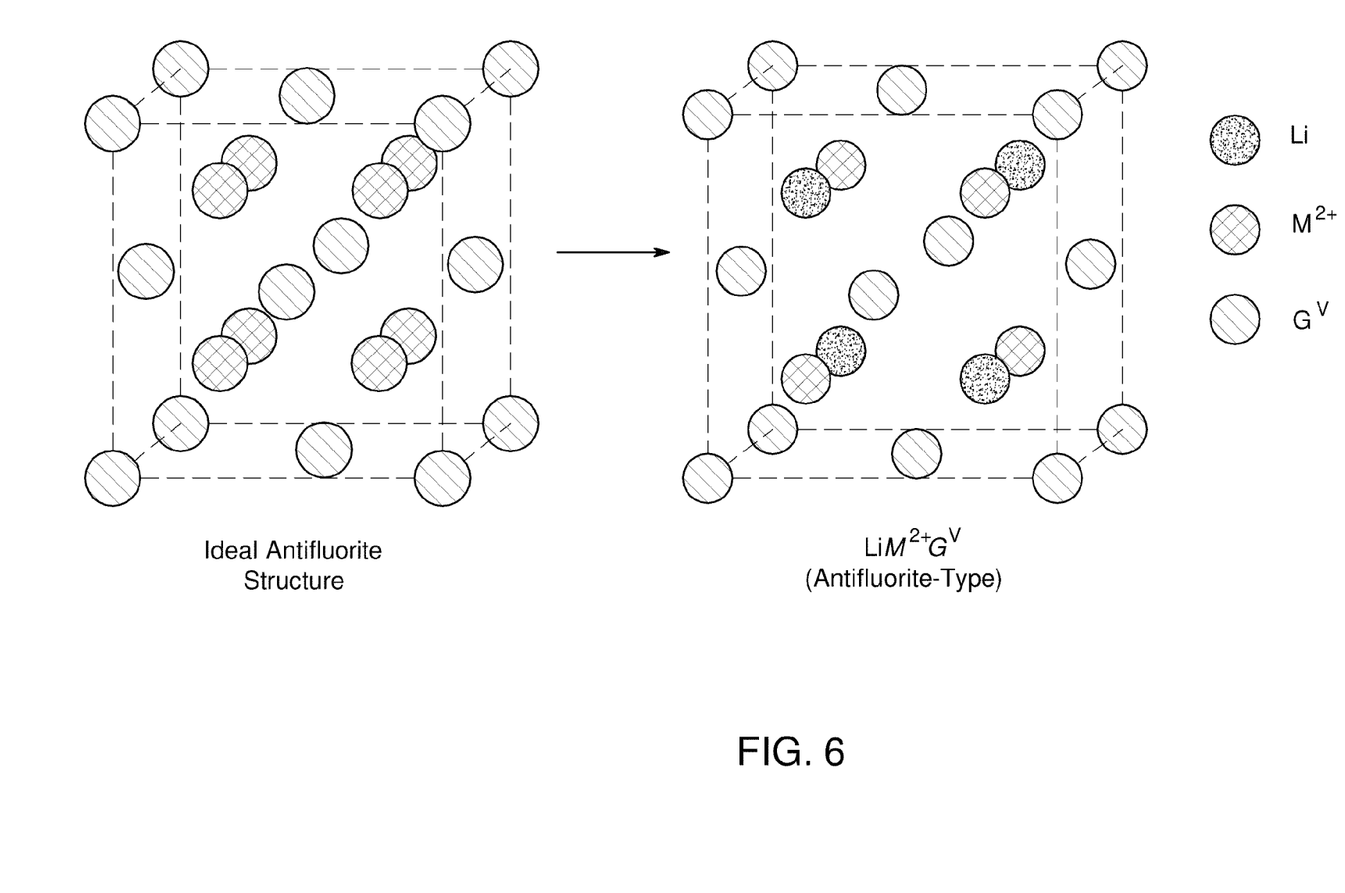
FIG. 6 is a graphical representation of antifluorite-type ordering in LiM$^{2+}$G$^V$ materials used in the neutron sensing material detector according to an embodiment of the invention.

Antifluorite-type ordering refers to a face-centered G$^V$ sublattice in which reside tetrahedrally-coordinated Li and M$^{2+}$ constituents. As illustrated in the semiconductor lattice of FIG. 6, Li and M$^{2+}$ each coordinate to four nearest G$^V$ neighbors and thus occupy all tetrahedral interstices of the sublattice. Population of these interstices may be statistically random or, as shown in FIG. 6, an arrangement of higher symmetry. The G$^V$ sublattice commonly forms a cubic close-packed structure (i.e., a cubic unit cell). Other unit cells (e.g., tetragonal, orthorhombic, etc.), however, are consistent with antifluorite-type ordering provided the aforementioned coordination is preserved.

Despite the chemical differences, LiM$^{2+}$G$^V$ antifluorite-type materials retain the semiconducting behavior of their zinc-blende III-V "siblings". In fact, the presence of small, electropositive Li$^+$ serves to stabilize a direct band gap. The M$^{2+}$-G$^V$ bonds in the (M$^{2+}$G$^V$)$^-$ zinc-blende sublattice display notably stronger covalency than that of the Li$^+$-G$^V$ bonds. The latter, on the other hand, exhibit strong ionic character. The resulting Li$^+$-(M$^{2+}$G$^V$)$^-$ ionic interaction is sufficient to distort the band structure of the (M$^{2+}$G$^V$)$^-$ zinc-blende sublattice, inducing a direct band-gap semiconductor out of an otherwise indirect one. Direct band-gap semiconductors are highly-preferred for radiation absorption and detection because the ionization and recombination of electron-hole pairs proceeds more efficiently via direct transitions.

LiM$^{2+}$G$^V$ antifluorite-type materials can be doped through compositional modification similar to that practiced with commercial semiconductors. This feature is useful to improve semiconductor transport properties by adjusting carrier concentrations (i.e., electron or hole). For example, a very small excess of Li$^+$ substituted for Zn$^{2+}$ in LiZnN creates a p-type semiconductor with enhanced hole concentration. In general, however, semiconductor doping is achieved by substituting an element which serves as an acceptor or donor relative to a reference constituent element, thus creating a p-type or n-type semiconductor, respectively. Examples in LiM$^{2+}$G$^V$ antifluorite-type materials include Mg for Li (i.e., donor), Ag for Cd on M$^{2+}$ the site (i.e., acceptor), S for P on the G$^V$ site (i.e., donor), and so forth. A more complete expansion is an acceptor or donor selected from the non-limiting group consisting of Li, Na, K, Rb, Be, Mg, Cu, Ag, Au, B, Al, Ga, In, Sc, Y, C, Si, Ge, Sn, O, S, Se, and Te. Alternatively, vacancy defects can be deliberately introduced with similar effect. Doping concentrations are typically very small, usually less than 0.01% by substitution. These methods are well-known to those skilled in the art and will not be further elaborated here.

As described above, the semiconductor material 12 comprises a composition of stoichiometry Li(M$_1^{2+}$, M$_2^{2+}$, M$_3^{2+}$, ...)(G$_1^V$, G$_2^V$, G$_3^V$, ...) and exhibits an antifluorite-type order, where Li=1, (M$_1^{2+}$+M$_2^{2+}$+M$_3^{2+}$+...)=1, and (G$_1^V$+G$_2^V$+G$_3^V$+...)=1. In other words, the semiconductor material 12 comprises a ternary composition of stoichiometry LiM$^{2+}$G$^V$ and exhibits an antifluorite-type ordering, where the stoichiometric fractions are Li=1, M$^{2+}$=1, and G$^V$=1, wherein an electron-hole pair is created by absorption of radiation, such as a fast neutron, and the like.

The semiconductor material 12 provides two useful characteristics: [1] a high Li-site density, which when enriched in $^6$Li, produces exceptional neutron-absorbing capabilities and [2] a semiconducting band-gap for the efficient conversion of absorbed photon and neutron energies into electrical currents. These characteristics can be exploited in applications for power generation or the spectroscopic detection of gamma and neutron radiation. The material can be tailored so as to detect only gamma photons, detect only neutron particles, or simultaneously detect gamma photons and neutron particles.

Other semiconductor materials that include neutron sensitive elements may have detrimental properties because: (i) any Li-containing detector relying on a substrate (silicon or similar semiconductors) or on an amorphous binder will dilute the neutron sensitivity; (ii) pure semiconductors with poor neutron reaction cross sections, like diamond or SiC, have extremely reduced sensitivity for practical purposes other than reactor core environments; (iii) pure semiconductors containing B, Gd, In, and other elements with isotopes of high neutron cross section (except Li), present very complex neutron absorption processes (i.e., additional gammas and conversion electrons are generated) which drastically reduce the spectroscopic performance; (iv) $^3$He is a gas and cannot be introduced in solid-state detectors.

Figure 2:
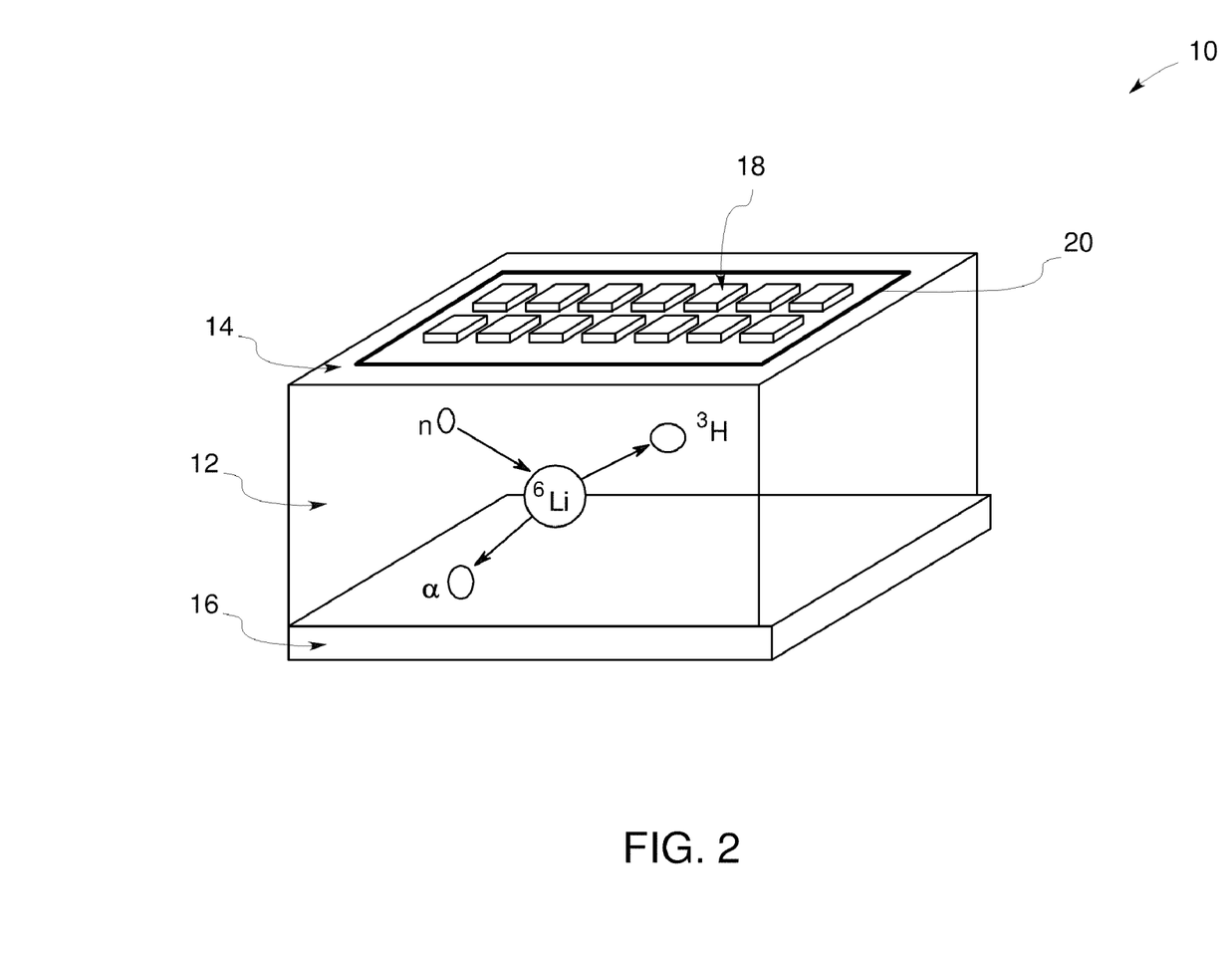
FIG. 2 is a perspective view of a neutron sensing material detector (NSD) with a pixellated anode with an optional guard ring to reduce leakage according to an alternate embodiment of the invention showing different angles for the emitted decay products; the guard ring may also form a guard grid wherein the outer perimeter and between each pixel on the anode side are enclosed by a grid to reduce leakage current

Referring now to FIG. 2, another embodiment of the NSD 10 is shown. In this embodiment, the anode 14 is divided into an array of pixels 18 for providing improved spatial and energy resolution. The pixellated anode 14 allows for the NSD 10 to have high-energy resolution and to be used as a neutron-imaging device. The pixellated anode 14 combined with the electric field enhances individual pixels 18 to detect neutron capture events as they occur, thereby providing improved spatial and energy resolution over the face of the anode 14 of the NSD 10. Electronics that are well-known in the art can sample each pixel 18 on a periodic basis and for a fixed sequence over the array of pixels 18. The signal value for each pixel 18 can be mapped to a color or grey scale normalized to all the other pixel values of the entire array of pixels 18 for a particular moment in time. This is similar to a "snapshot" of a picture where here the pixels 18 are similar to those found in a CCD or CMOS camera and the entire array of pixels 18 of the anode 14 for a particular moment in time would be a picture frame. If a material of varying density were placed between a monoenergetic neutron source and the NSD 10, the neutrons passing through the material would be attenuated to different degrees depending upon the material density the neutrons have passed through. The different attenuation values of the neutrons would translate to different signal values of the anode pixels 18 of the NSD 10, and one would be able to resolve the different densities of the material the neutrons have passed through. In this embodiment, an optional guard ring 20 (or guard grid surround each pixel) may be installed around the anode 14 to minimize leakage current.

The invention addresses the detection and energy measurement of fast neutrons emitted by fission, fusion, or other types of nuclear reactions, in the presence of background neutrons and gamma rays. A few examples of sources of fast neutrons and their applications are: (a) Plutonium for nuclear weapons and reactors; (b) $^{251}$Cf for cancer brachytherapy; (c) $^{241}$Am—Be for moisture and oil gauges and neutron activation analysis; (d) D-D and D-T fusion reactions from neutron generators and tokamaks; (e) advanced neutron spallation sources for study of materials and structural biology.

As described above, in a detector consisting of homogeneous semiconductor medium containing $^6$Li atoms, a neutron capture reaction produces charged products that interact readily with the electrons and the lattice ions, rapidly converting their kinetic energy into a cascade of secondary electron-hole pairs. When an electric field is created inside the semiconductor, the secondary electrons and holes drift from the point of detection and their total charge q can be collected by electrodes. The neutron detection signal is represented by the electrical charge q, which is a function of the amount of energy (4.78+E') MeV released by the neutron capture. If the semiconductor material is of sufficient purity and uniformity to rule out charge trapping, the dependence between the signal q and the neutron energy E' is a direct proportionality relation. In this case, a simple energy calibration allows the measurement of E'.

Because the Q-value of a $^6$Li capture reaction adds to any incident neutron energy (i.e., $E_n$+4.78 MeV), the signal from a neutron event capture is above any gamma signal. For Li-semiconductor materials of sufficient purity and uniformity, the large number of electron-hole pairs generated guarantees also very good energy resolution. This allows separation of background neutrons by simple spectral subtraction. Also, any neutrons that have been scattered prior detection emerge in spectra at the low-energy end versus the uncollided neutrons from the source.

Due to the inherent advantages of semiconductor detection and the unique properties of the $^6$Li neutron reaction, the invention offers an optimal solution to the signal discrimination problems of the prior art. This allows the reliable acquisition of fast neutron spectra, which are signatures of their parent radionuclides (for example, Pu, $^{252}$Cf, $^{241}$Am+Be, etc.), or of the nuclear reaction producing them (e.g., D-D or D-T).

Accordingly, the teachings herein provide the technical effect of separating alpha radiation fields and neutron radiation fields from gamma radiation fields. Of course, one skilled in the art will recognize that other embodiments may be realized. For example, accounting for beta radiation fields using appropriate scintillators may be realized. Other radiation types that may be evaluated include, without limitation, alpha particles, beta particles, gamma rays, ions and neutrons. The apparatus need not be limited to "hand held" implementations, and may include other physical constructions, such as, for example, permanent installations. Accordingly, the teachings herein are not limited to the exemplary embodiments provided.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A neutron sensing material detector, comprising:
   an anode;
   a cathode; and
   a semiconductor material disposed between the anode and the cathode,
   wherein the semiconductor material comprises a ternary composition of stoichiometry $LiM^{2+}G^V$ and exhibits an antifluorite-type ordering, where the stoichiometric fractions are Li=1, $M^{2+}$=1, and $G^V$=1, and
   wherein an electric field is applied between the anode and cathode and wherein electron-hole pairs are created by absorption of radiation, and the electron-hole pairs are detected by the current they generate between the anode and the cathode.

2. The detector according to claim 1, wherein the anode comprises an array of pixels for providing spatial and energy resolution.

3. The detector according to claim 2, further comprising a guard ring disposed about the anode to reduce leakage current.

4. The detector according to claim 1, wherein $M^{2+}$ is selected from the group consisting of Be, Mg, Ca, Sr, Ba, V, Cr, Mn, Fe, Ru, Os, Cr, Rh, Ir, Ni, Pd, Pt, Cu, Zn, Cd, Hg, Sn, and Pb.

5. The detector according to claim 1, wherein $G^V$ is selected from the group consisting of N, P, As, Sb, Bi.

6. The detector according to claim 1, wherein Li comprises $^6$Li, and wherein $M^{2+}$ and $G^V$ both have a thermal neutron cross-section of less than 0.1 barn.

7. The detector according to claim 1, wherein Li consists essentially of $^7$Li, and wherein $M^{2+}$ and $G^V$ both have a thermal neutron cross-section of less than 0.1 barn.

8. The detector according to claim 1, wherein the semiconductor material is doped with an element that serves as an acceptor or donor for Li, $M^{2+}$ or $G^V$, thereby creating a p-type or n-type semiconductor.

9. The detector according to claim 8, wherein the element that serves as an acceptor or donor is selected from the group consisting of Li, Na, K, Rb, Be, Mg, Cu, Ag, Au, B, Al, Ga, In, Sc, Y, C, Si, Ge, Sn, O, S, Se, and Te.

10. The detector according to claim 1, further comprising a plurality of anodes.

11. The detector according to claim 10, further comprising a guard grid disposed about the plurality of anodes to reduce leakage current.

12. A method for neutron detection, comprising:
disposing a semiconductor material between an anode and a cathode, wherein an electric field is applied between the anode and the cathode, wherein the semiconductor material comprises a ternary composition of stoichiometry $LiM^{2+}G^V$ and exhibits an antifluorite-type ordering, where the stoichiometric fractions are Li=1, $M^{2+}$=1, and $G^V$=1, and wherein electron-hole pairs are created by absorption of radiation; and
detecting the current generated by the electron-hole pairs.

13. The method according to claim 12, wherein the anode comprises an array of pixels for providing spatial and energy resolution.

14. The method according to claim 12, further comprising the step of placing a guard ring about the anode to reduce leakage current.

* * * * *